United States Patent
Shen et al.

(10) Patent No.: US 8,227,924 B2
(45) Date of Patent: Jul. 24, 2012

(54) SUBSTRATE STAND-OFFS FOR SEMICONDUCTOR DEVICES

(75) Inventors: Cheng Hung Shen, Taichung (TW); Tin-Hao Kuo, Hsin-CHu (TW); Chen-Cheng Kuo, Chu-Pei (TW); Chen-Shien Chen, Zhubei (TW); Yao-Chun Chuang, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 101 days.

(21) Appl. No.: 12/835,458

(22) Filed: Jul. 13, 2010

(65) Prior Publication Data

US 2012/0012985 A1   Jan. 19, 2012

(51) Int. Cl.
*H01L 23/48* (2006.01)

(52) U.S. Cl. ........ 257/775; 257/780; 257/E23.021; 438/108

(58) Field of Classification Search .......... 257/775, 257/780, E23.021; 438/108
See application file for complete search history.

(56) References Cited

U.S. PATENT DOCUMENTS

| | | | |
|---|---|---|---|
| 2009/0045523 A1* | 2/2009 | Fan et al. | 257/777 |
| 2009/0200663 A1 | 8/2009 | Daubenspeck et al. | |
| 2011/0198747 A1* | 8/2011 | Kuo et al. | 257/737 |

* cited by examiner

*Primary Examiner* — Trung Q Dang
(74) *Attorney, Agent, or Firm* — Slater & Matsil, L.L.P.

(57) ABSTRACT

Substrate stand-offs for use with semiconductor devices are provided. Active pillars and dummy pillars are formed on a first substrate such that the dummy pillars may have a height greater than a height of the active pillars. The dummy pillars act as stand-offs when joining the first substrate to a second substrate, thereby creating greater uniformity. In an embodiment, the dummy pillars may be formed simultaneously as the active pillars by forming a patterned mask having openings with a smaller width for the dummy pillars than for the active pillars. When an electro-plating process of the like is used to form the dummy and active pillars, the smaller width of the dummy pillar openings in the patterned mask causes the dummy pillars to have a greater height than the active pillars.

20 Claims, 10 Drawing Sheets

SUBSTRATE STAND-OFFS FOR SEMICONDUCTOR DEVICES

TECHNICAL FIELD

This disclosure relates generally to semiconductor devices and, more particularly, to stand-offs for joining together two or more substrates.

BACKGROUND

The past few decades have seen many shifts in electronics and semiconductor packaging that have impacted the entire semiconductor industry. The introduction of surface-mount technology (SMT) and ball grid array (BGA) packages were generally important steps for high-throughput assembly of a wide variety of integrated circuit (IC) devices, while at the same time allowing for reduction of the pad pitch on the printed circuit board. Conventionally packaged ICs have a structure basically interconnected by fine gold wire between metal pads on the die and electrodes spreading out of molded resin packages. Dual Inline Package (DIP) or Quad Flat Package (QFP) are fundamental structures of current IC packaging. However, increased pin count peripherally designed and arranged around the package typically results in too short of a pitch of lead wire, yielding limitations in board mounting of the packaged chip.

Chip-scale or chip-size packaging (CSP) and BGA packages are just some of the solutions that enable dense electrode arrangement without greatly increasing the package size. Some CSP techniques may provide the additional advantage of allowing for wafer packaging on a chip-size scale. CSP typically results in packages within 1.2 times the die size, which greatly reduces the potential size of devices made with the CSP material.

Some CSP or BGA packages rely on bumps of solder to provide an electrical connection between contacts on the die and contacts on a substrate, such as a packaging substrate, a printed circuit board (PCB), another die/wafer, or the like. Other CSP or BGA packages utilize a solder ball or bump placed onto a bump electrode or pillar, relying on the soldered joint for structural integrity. The substrates are joined together by aligning the contacts on one die with the contacts on the other die. Pressure is applied and a solder reflow process is performed.

Oftentimes, however, the distance between the substrates may vary. For example, many times the distance between the substrates may be greater near the center of the substrates as compared with the edges. This may be caused by warpage, differences in the applied pressure, differences in the amount of resistance, or the like. As a result of the varying distances, solder wetting along the sides of pillar structures may occur, particularly along the edges of the substrate where the distance is typically smaller than the center region.

SUMMARY

Stand-offs for a semiconductor structure is provided. A substrate having active pillars and dummy pillars is formed such that the active pillars have a first width and a first height, and the dummy pillars have a second width and a second height, the second width being less than the first width and the second height being greater than the first height.

In an embodiment, the stand-offs may be formed by patterning a mask over the substrate, wherein the patterned mask has dummy pillar openings and active pillar openings. The dummy pillar openings have a width less than the active pillar openings. The dummy pillars and the active pillars are formed in the respective openings and the patterned mask may be removed. In this embodiment, the dummy pillars have a width less than and a height greater than the active pillars.

Other embodiments are disclosed.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative of specific ways to make and use the embodiments, and do not limit the scope of the disclosure.

Figure 1:
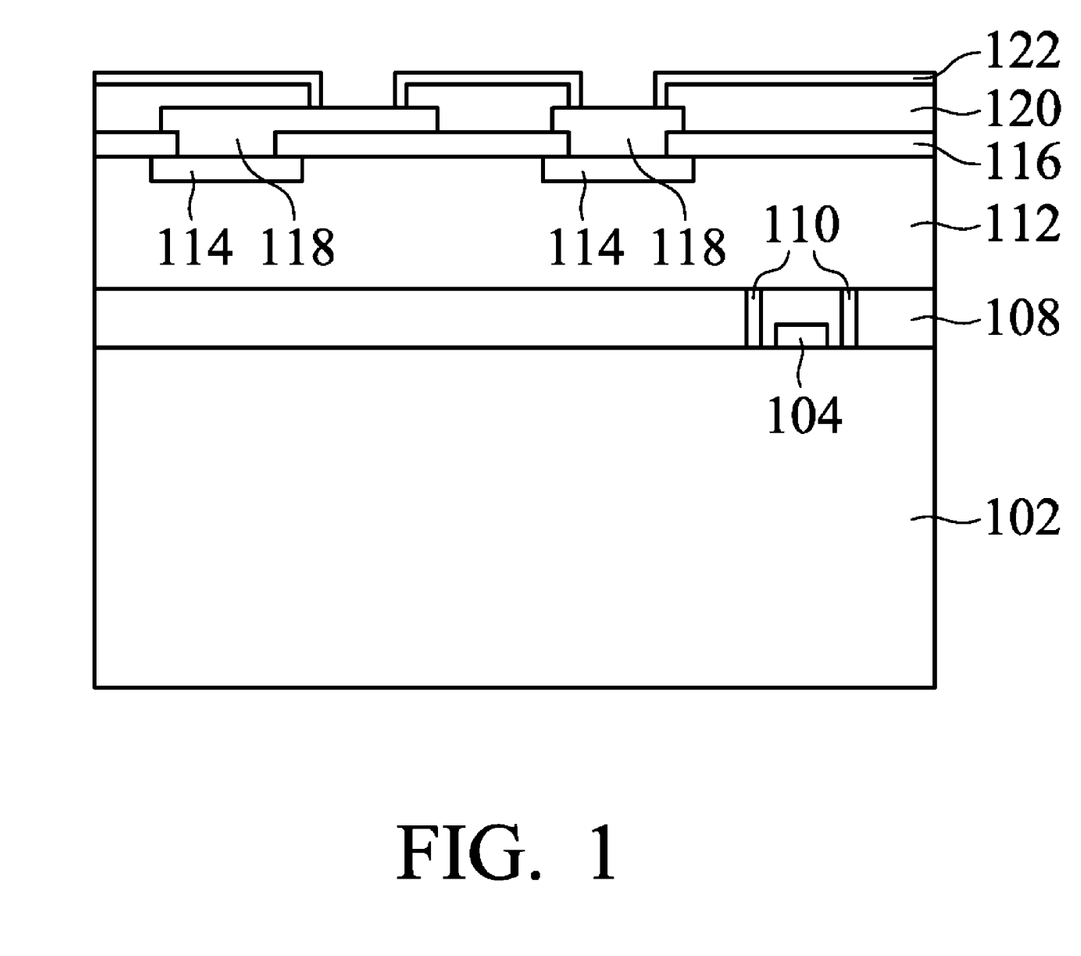
FIGS. 1-5 illustrate various intermediate stages of a method of forming a semiconductor device having dummy pillars in accordance with an embodiment.

FIGS. 1-5 illustrate various intermediate stages of a method of forming a semiconductor device having dummy pillars in accordance with an embodiment. Referring first to FIG. 1, a portion of a substrate 102 having electrical circuitry 104 formed thereon is shown in accordance with an embodiment. The substrate 102 may comprise, for example, bulk silicon, doped or undoped, or an active layer of a semiconductor-on-insulator (SOI) substrate. Generally, an SOI substrate comprises a layer of a semiconductor material, such as silicon, formed on an insulator layer. The insulator layer may be, for example, a buried oxide (BOX) layer or a silicon oxide layer. The insulator layer is provided on a substrate, typically a silicon or glass substrate. Other substrates, such as a multi-layered or gradient substrate may also be used.

Electrical circuitry 104 formed on the substrate 102 may be any type of circuitry suitable for a particular application. In an embodiment, the electrical circuitry 104 includes electrical devices formed on the substrate 102 with one or more dielectric layers overlying the electrical devices. Metal layers may be formed between dielectric layers to route electrical signals between the electrical devices. Electrical devices may also be formed in one or more dielectric layers.

For example, the electrical circuitry 104 may include various N-type metal-oxide semiconductor (NMOS) and/or P-type metal-oxide semiconductor (PMOS) devices, such as transistors, capacitors, resistors, diodes, photo-diodes, fuses, and the like, interconnected to perform one or more functions. The functions may include memory structures, processing structures, sensors, amplifiers, power distribution, input/output circuitry, or the like. One of ordinary skill in the art will appreciate that the above examples are provided for illustrative purposes only to further explain applications of some illustrative embodiments and are not meant to limit the disclosure in any manner. Other circuitry may be used as appropriate for a given application.

Also shown in FIG. 1 is an inter-layer dielectric (ILD) layer 108. The ILD layer 108 may be formed, for example, of a low-K dielectric material, such as phosphosilicate glass (PSG), borophosphosilicate glass (BPSG), fluorinated silicate glass (FSG), $SiO_xC_y$, Spin-On-Glass, Spin-On-Polymers, silicon carbon material, compounds thereof, composites thereof, combinations thereof, or the like, by any suitable method known in the art, such as spinning, chemical vapor deposition (CVD), and plasma-enhanced CVD (PECVD). It should also be noted that the ILD layer 108 may comprise a plurality of dielectric layers.

Contacts, such as contacts 110, are formed through the ILD layer 108 to provide an electrical contact to the electrical circuitry 104. The contacts 110 may be formed, for example, by using photolithography techniques to deposit and pattern a photoresist material on the ILD layer 108 to expose portions of the ILD layer 108 that are to become the contacts 110. An etch process, such as an anisotropic dry etch process, may be used to create openings in the ILD layer 108. The openings may be lined with a diffusion barrier layer and/or an adhesion layer (not shown), and filled with a conductive material. In an embodiment, the diffusion barrier layer comprises one or more layers of TaN, Ta, TiN, Ti, CoW, or the like, and the conductive material comprises copper, tungsten, aluminum, silver, and combinations thereof, or the like, thereby forming the contacts 110 as illustrated in FIG. 1.

One or more inter-metal dielectric (IMD) layers 112 and the associated metallization layers (not shown) are formed over the ILD layer 108. Generally, the one or more IMD layers 112 and the associated metallization layers are used to interconnect the electrical circuitry 104 to each other and to provide an external electrical connection. The IMD layers 112 may be formed of a low-K dielectric material, such as FSG formed by PECVD techniques or high-density plasma CVD (HDPCVD), or the like, and may include intermediate etch stop layers. Contacts 114 are provided in the uppermost IMD layer to provide external electrical connections.

It should also be noted that one or more etch stop layers (not shown) may be positioned between adjacent ones of the dielectric layers, e.g., the ILD layer 108 and the IMD layers 112. Generally, the etch stop layers provide a mechanism to stop an etching process when forming vias and/or contacts. The etch stop layers are formed of a dielectric material having a different etch selectivity from adjacent layers, e.g., the underlying substrate 102, the overlying ILD layer 108, and the overlying IMD layers 112. In an embodiment, etch stop layers may be formed of SiN, SiCN, SiCO, CN, combinations thereof, or the like, deposited by CVD or PECVD techniques.

A first passivation layer 116, such as a dielectric material, may be formed and patterned over the surface of the uppermost IMD layer 112 to form an opening over the contacts 114 and to protect the underlying layers from various environmental contaminants. Thereafter, conductive pads 118 are formed and patterned over the first passivation layer 116. The conductive pads 118 provide an electrical connection upon which contact bumps may be formed for external connections. The conductive pads 118 may also act as a redistribution layer (RDL) to provide a desired pin or ball layout. The conductive pads 118 may be formed of any suitable conductive materials, such as copper, tungsten, aluminum, silver, and combinations thereof, or the like.

A second passivation layer 120, such as a dielectric layer, is formed and patterned over the conductive pads 118 as illustrated in FIG. 1. The second passivation layer 120 may be formed of any suitable method, such as CVD, PVD, or the like.

FIG. 1 further illustrates a protective layer 122 formed over the second passivation layer 120 and patterned to expose at least a portion of the conductive pads 118. The protective layer 122 may be, for example, a polymer (e.g., polyimide, polybenzoxasole, or the like) formed by any suitable process, such as a lithography coater process, or the like, and acts to further prevent damage from the environment, such as moisture, oxidation, or the like.

Any suitable process may be used to form the structures discussed above and will not be discussed in greater detail herein. As one of ordinary skill in the art will realize, the above description provides a general description of the features of the embodiment and that numerous other features may be present. For example, other circuitry, liners, barrier layers, under-bump metallization configurations, and the like, may be present. The above description is meant only to provide a context for embodiments discussed herein and is not meant to limit the disclosure or the scope of any claims to those specific embodiments.

Figure 2:
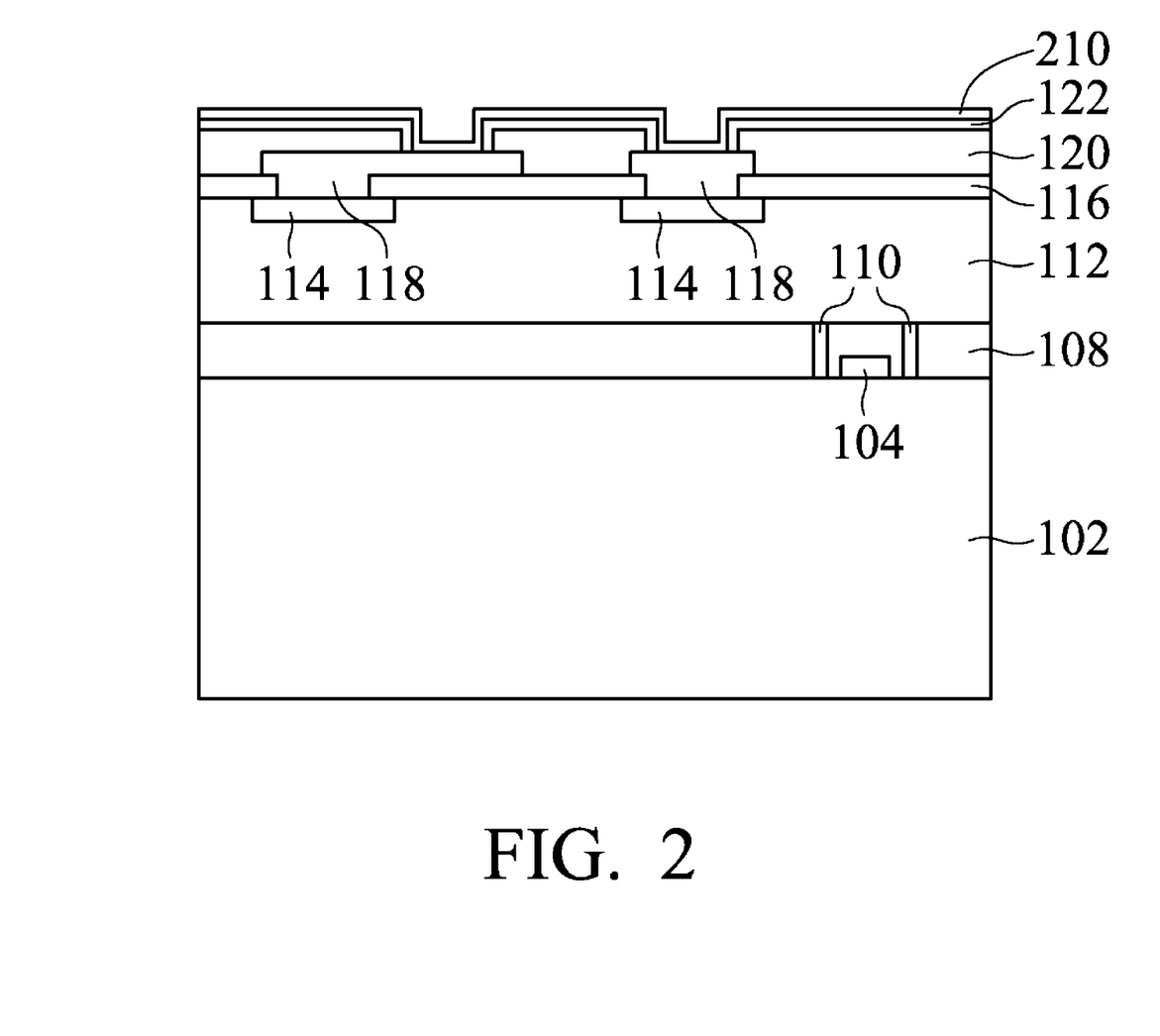

FIG. 2 illustrates a seed layer 210 deposited over the surface of the protective layer 122. The seed layer 210 is a thin layer of a conductive material that aids in the formation of a thicker layer during subsequent processing steps. In an embodiment, the seed layer 210 may be formed by depositing one or more thin conductive layers, such as one or more thin layers of Cu, Ti, Ta, TiN, TaN, combinations thereof, or the like, using CVD or physical vapor deposition (PVD) techniques. For example, in an embodiment a layer of Ti is deposited by a PVD process to form a diffusion barrier film and a layer of Cu is deposited by a PVD process to form a Cu seed layer.

Figure 3:
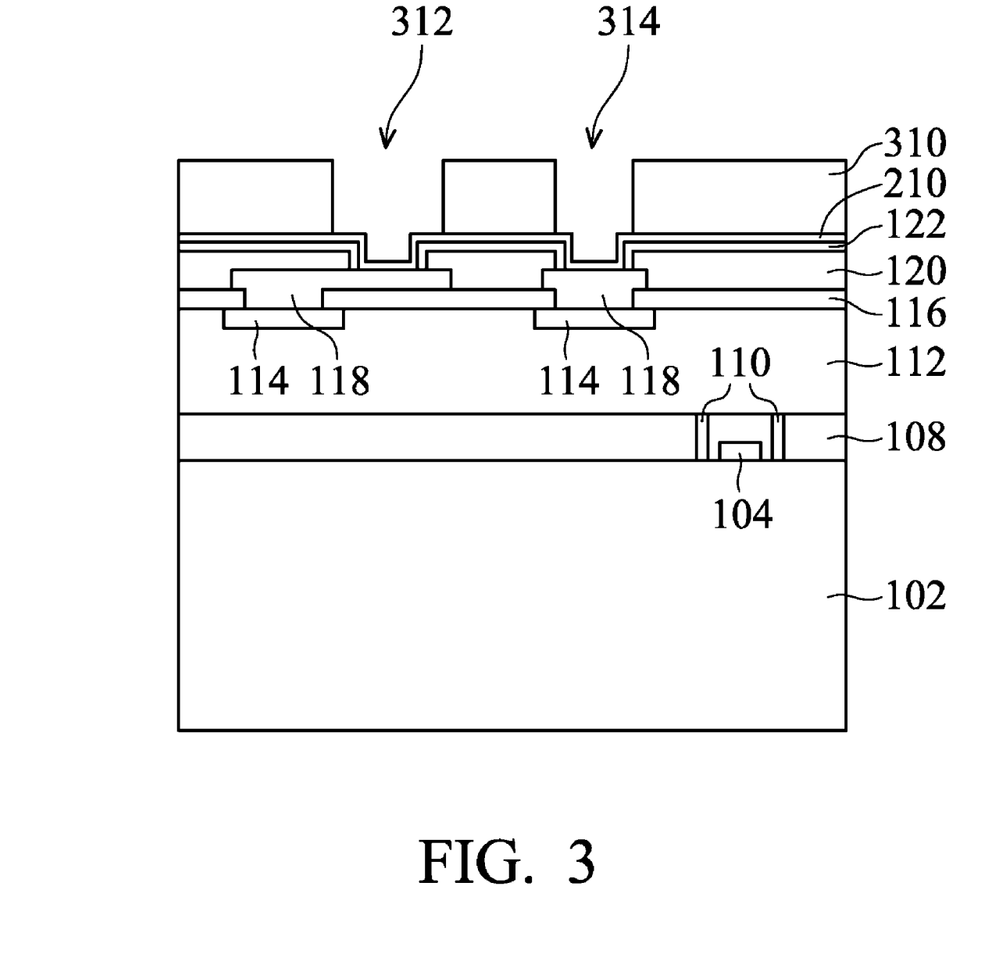

Thereafter, as illustrated in FIG. 3, a patterned mask 310 is formed over the seed layer 210 in accordance with an embodiment. The patterned mask 310 is patterned to provide an active pillar opening 312 and a dummy pillar opening 314, wherein the patterned mask 310 defines the lateral boundaries of the conductive and dummy pillars to be subsequently formed as discussed in greater detail below. The patterned mask 310 may be a patterned photoresist mask, hard mask, a combination thereof, or the like. In an embodiment, the patterned mask 310 has a thickness of about 30 μm to about 200 μm.

It should be noted that the dummy pillar opening 314 is placed over the conductive layer 118 and the contacts 114 for illustrative purposes only. As the dummy pillar to be formed in the dummy pillar opening 314 in subsequent processing does not act as an active electrical connection between the substrate 102 and another substrate to be connected to the substrate 102, the dummy pillar opening 314 may be formed over an available region of a passivation and/or polyimide layer.

Figure 4:
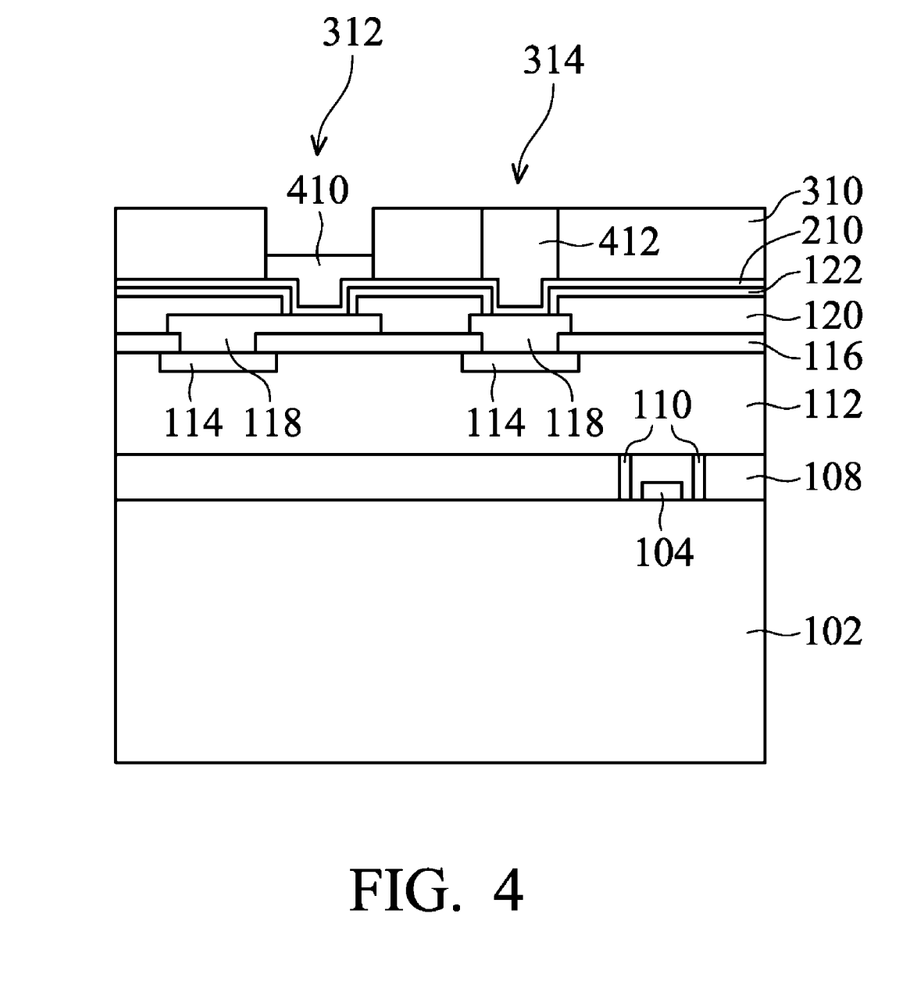

FIG. 4 illustrates the formation of an active pillar 410 and a dummy pillar 412 in accordance with an embodiment. The active pillar 410 and the dummy pillar 412 may be formed of any suitable conductive material, including Cu, Ni, Pt, Al, combinations thereof, or the like, and may be formed through any number of suitable techniques, including PVD, CVD, electrochemical deposition (ECD), molecular beam epitaxy (MBE), atomic layer deposition (ALD), electroplating, and the like.

The active pillar 410 and the dummy pillar 412 may be formed by, for example, an electroplating process wherein the wafer is submerged or immersed in the electroplating solution. The wafer surface is electrically connected to the negative side of an external DC power supply such that the wafer functions as the cathode in the electroplating process. A solid conductive anode, such as a copper anode, is also immersed in the solution and is attached to the positive side of the power supply. The atoms from the anode are dissolved into the solution, from which the cathode, e.g., the wafer, acquires, thereby plating the exposed conductive areas of the wafer, e.g., exposed portions of the seed layer 210 within the active pillar opening 312 and the dummy pillar opening 314 (see FIG. 3) of the patterned mask 310. Other processes, however, may be used.

As noted above, the dummy pillar opening 314 has a smaller width than the active pillar opening 312. As a result of the smaller width, the dummy pillar 412 tends to grow in the vertical direction faster than the active pillar 410 such that the dummy pillar 412 has a height greater than the active pillar 410. This allows, among other things, for the active pillar 410 and the dummy pillar 412 to be formed simultaneously without the need for additional process steps to form each individually.

Figure 5:
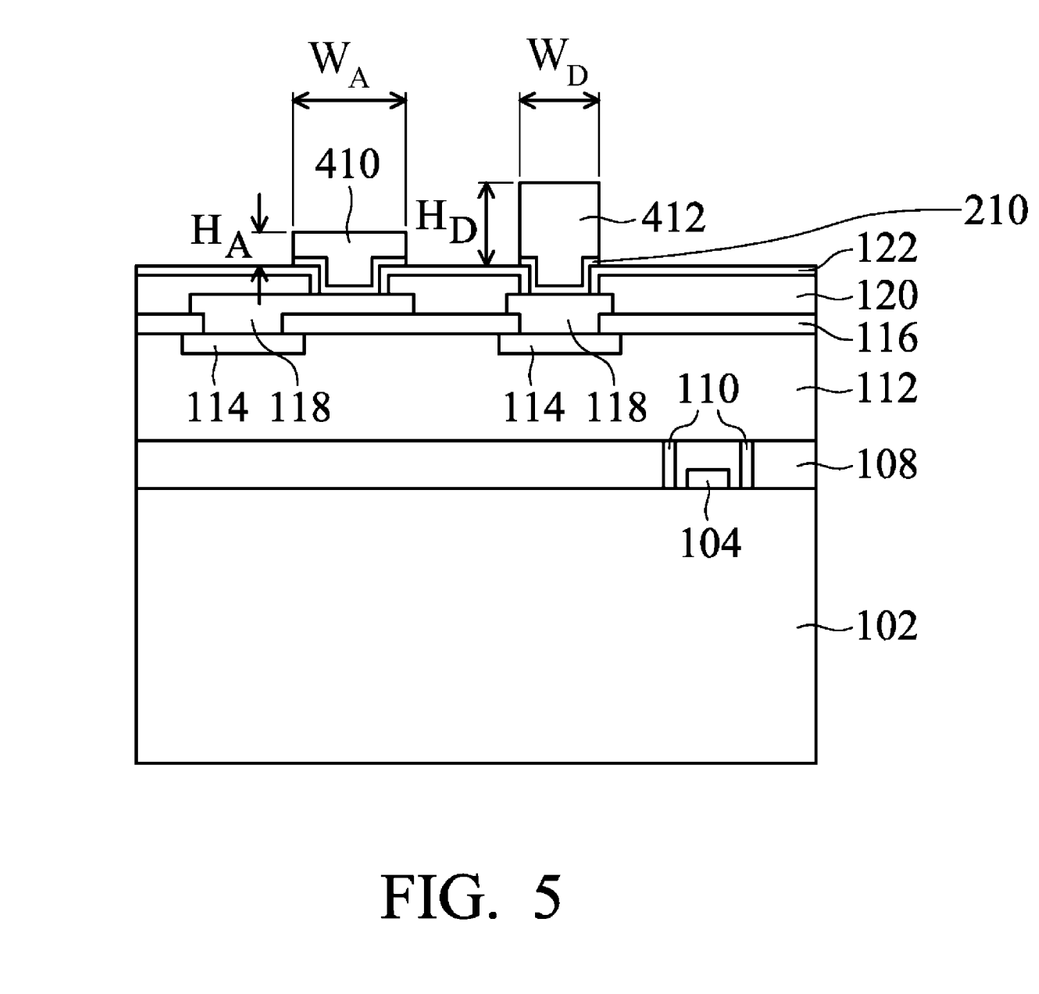

Thereafter, as illustrated in FIG. 5, the patterned mask 310 may be removed. In embodiments in which the patterned mask 310 is formed from photoresist materials, the photoresist may be stripped by, for example, a chemical solution such as a mixture of ethyl lactate, anisole, methyl butyl acetate, amyl acetate, cresol novolak resin, and diazo photoactive compound (referred to as SPR9), or another stripping process. A cleaning process, such as a wet dip in a chemical solution of phosphoric acid ($H_3PO_4$) and hydrogen peroxide ($H_2O_2$), referred to as DPP, with 1% hydrofluoric (HF) acid, or another cleaning process, may be performed to remove exposed portions of the seed layer 210 and any contaminants from the surface of the protective layer 122.

In an embodiment, the active pillar 410 has a height $H_A$ between about 30 µm and about 150 µm and a width $W_A$ between about 40 µm and about 120 µm, and the dummy pillar 412 has a height $H_D$ between about 40 µm and about 120 µm and a width $W_D$ between about 30 µm and about 150 µm. In an embodiment, a ratio of the width of the dummy pillar 412 to the width of the active pillar is equal to or greater than about 0.2 and equal to or less than about 0.9.

It should be appreciated that a cross section of the dummy pillar 412 may take any shape in a plan view. For example, the dummy pillar 412 may be circular, triangular, square, rectangular, hexagonal, octagonal, polyhedron, or the like. Furthermore, the dummy pillar 412 may include multiple extensions, each extension having a longitudinal axis extending in a different direction, such as an L-shape, a T-shape, a star-shape, or the like. It should also be noted that dummy pillars having different shapes may be included on a single die.

Figure 6:
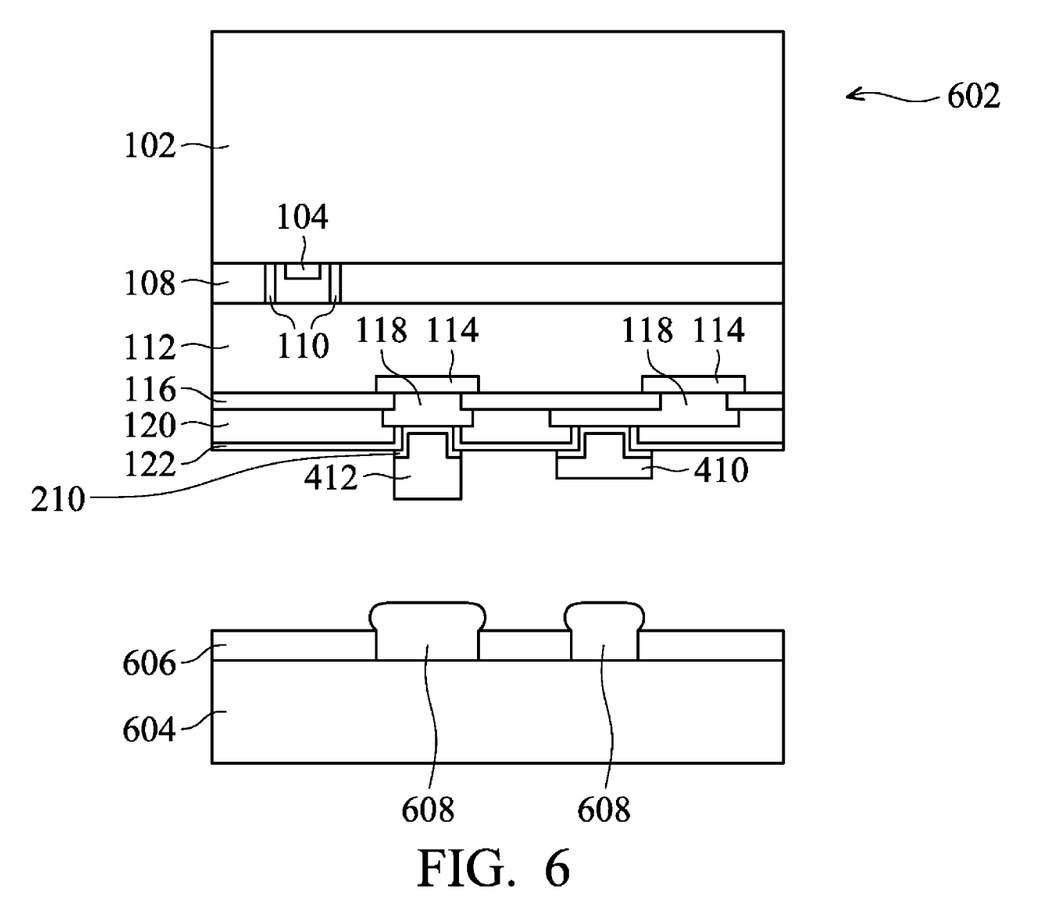
FIGS. 6 and 7 illustrate joining together two substrates in accordance with an embodiment.
Figure 7:
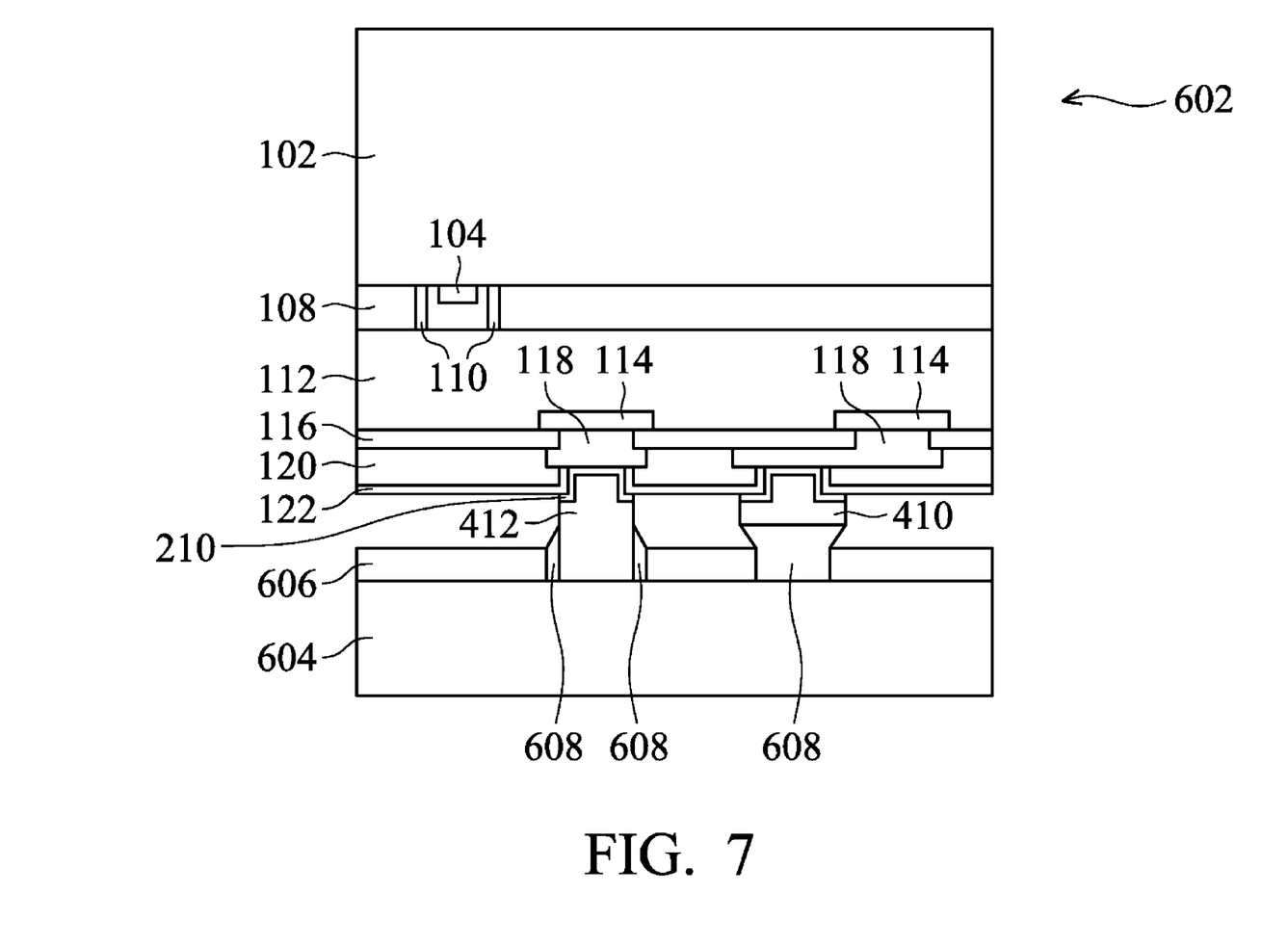

FIGS. 6 and 7 illustrate attaching a first substrate 602 to a second substrate 604 in accordance with an embodiment. The first substrate 602 may be formed similar to that described above with reference to FIGS. 1-5. The second substrate 604 may comprise an integrated circuit die, a packaging substrate, an interposer, a high-density interconnect, a ceramic substrate, an organic substrate, or the like. As such, the second substrate 604 may comprise various contact pads, metallization layers, redistribution lines, through-substrate vias, and/or the like. An upper surface of the second substrate 604 may comprise a passivation layer or a polyimide layer to protect the second substrate 604 from environmental contaminants. The second substrate 604 has a solder resist mask 606 formed thereon and solder bumps/balls 608 formed within openings in the solder resist mask 606. In an embodiment, the solder bumps/balls 608 comprises SnPb, a high-Pb material, a Sn-based solder, a lead-free solder, or other suitable conductive material.

As illustrated in FIG. 6, openings in the solder resist mask 606 correspond to the locations of the active pillar 410 and the dummy pillar 412. Thus, when joined together as illustrated in FIG. 7, the dummy pillar 412 extends into the opening to rest directly on an upper surface of the second substrate 604. After a reflow process, the solder balls/bumps 608 forms an electrical connection to the active pillar 410 and the dummy pillar 412. While the dummy pillar 412 is not used to transmit electrical signals between electrical components, the solder balls/bumps 608 help provide a stronger physical bond between the first substrate 602 and the second substrate 604.

Figure 8:
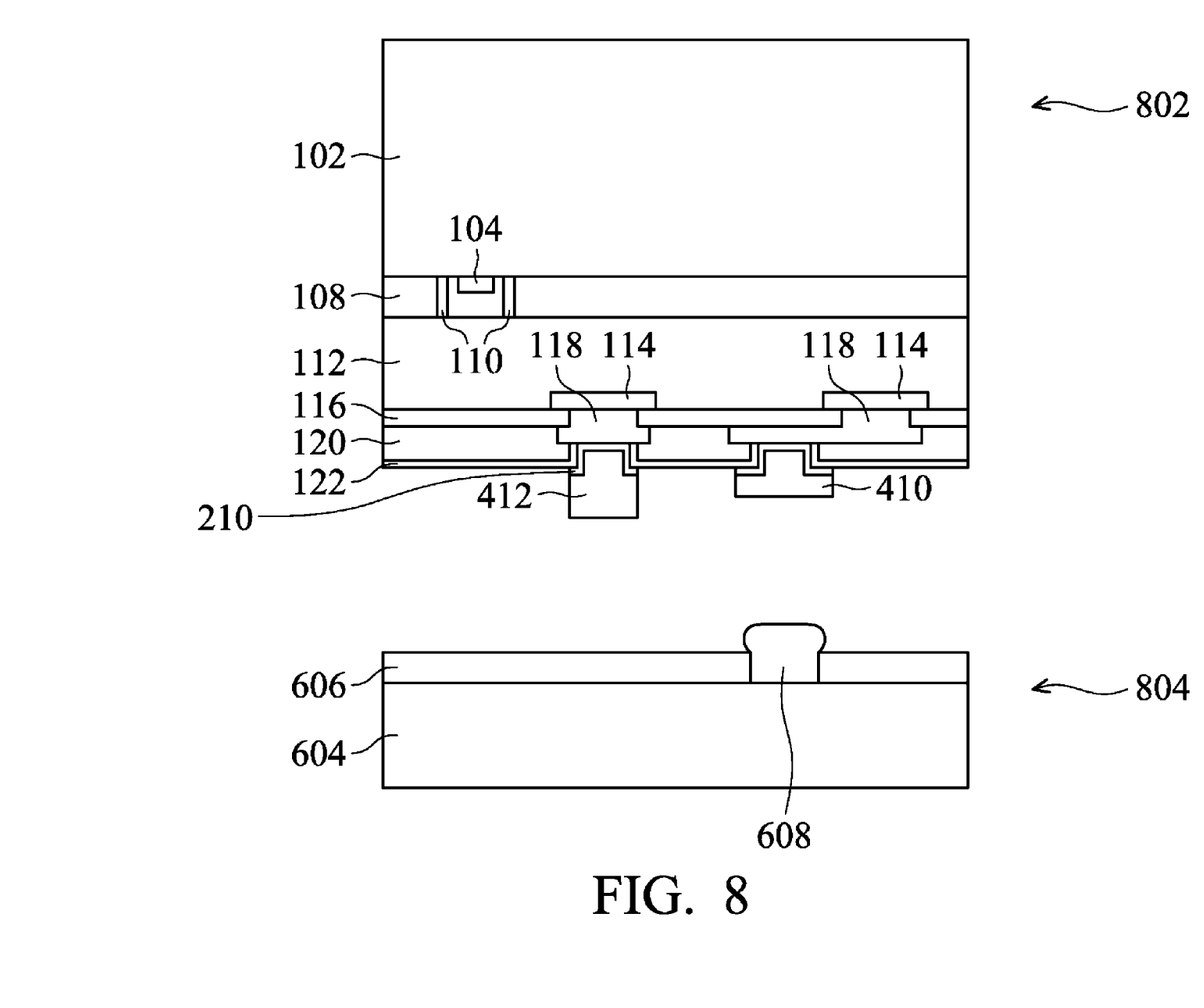
FIGS. 8 and 9 illustrate joining together two substrates in accordance with another embodiment.
Figure 9:
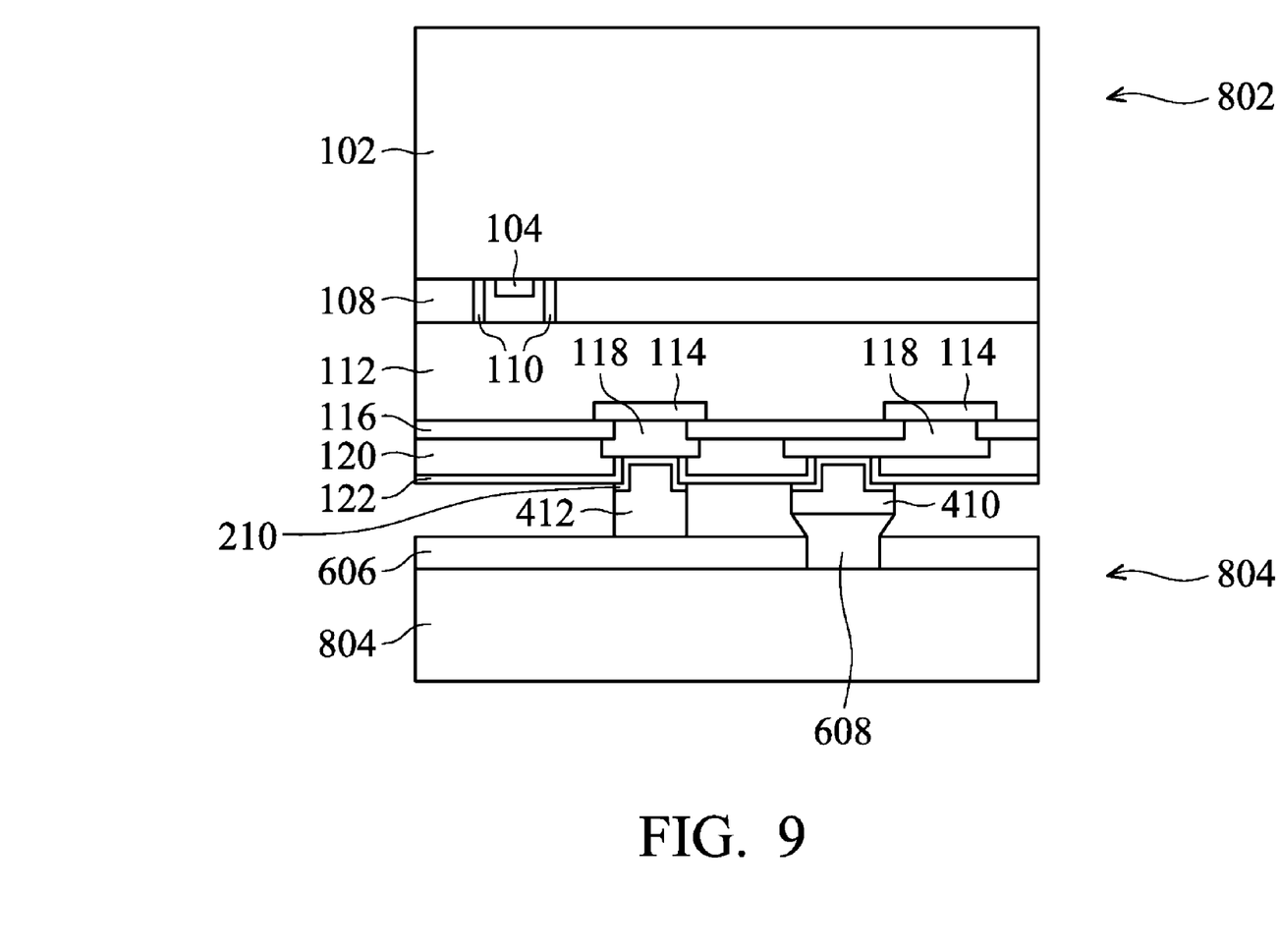

FIGS. 8 and 9 illustrate another embodiment in which a first substrate 802 is attached to a second structure 804, wherein the first substrate 802 may be a substrate such as that disclosed above with reference to FIGS. 1-5 and the second structure 804 may be a substrate such as the second substrate 604 discussed above with reference to FIGS. 6 and 7, wherein like reference numerals refer to like elements. In contrast to the embodiments illustrated in FIGS. 6 and 7, the solder resist mask 606 does not have an opening corresponding to the dummy pillar 412. As shown in FIG. 9, when joined together the dummy pillar 412 rests on a surface of the solder resist mask 606. In this embodiment, the dummy pillar 412 does not need to be as high.

Figure 10:
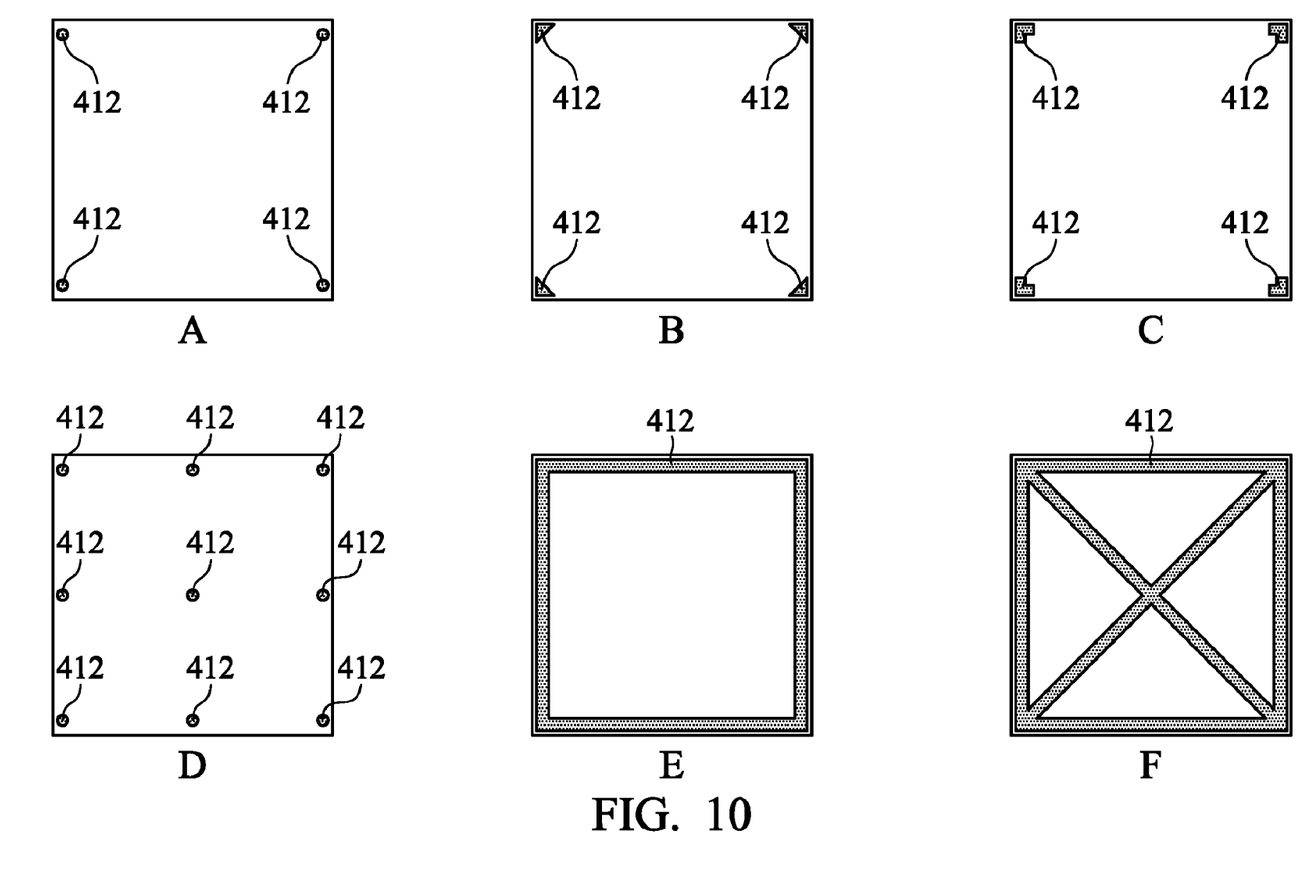
FIGS. 10A-10F illustrate patterns of dummy pillars that may be used in accordance with some embodiments.

FIGS. 10A-10F illustrate various placements and/or shapes for the dummy pillars 412. For example, FIGS. 10A-10C illustrate circular, triangular, and L-shaped dummy pillars 412, respectively, positioned in the corners of a die 1002. FIG. 10D illustrates an embodiment in which dummy pillars 412 are arranged in the four corners as well as dummy pillars 412 along a middle region of each side and a dummy pillar 412 in the center of the die. FIG. 10E illustrates another embodiment in which dummy pillars 412 are arranged along a periphery of the die, and FIG. 10F illustrates the embodiment of FIG. 10E with an "X" formed joining diagonal corners. It should be noted that FIGS. 10E and 10F illustrate solid lines for locations where dummy pillars are arranged in a line. In these embodiments, the dummy pillars may be placed at regular or irregular intervals. In other embodiments, other configurations may be used.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A semiconductor structure comprising:
   a first substrate;
   an active pillar on the first substrate, the active pillar having a first width and a first height; and
   a dummy pillar on the first substrate, the dummy pillar having a second width and a second height, the second width being less than the first width, the second height being greater than the first height, the dummy pillar being formed of an electrically conductive material.

2. The semiconductor structure of claim 1, wherein a ratio of the second width to the first width is equal to or greater than about 0.2 and equal to less than about 0.9.

3. The semiconductor structure of claim 1, wherein a cross section of the dummy pillar along a plane parallel to the first substrate is circular.

4. The semiconductor structure of claim 1, wherein a cross section of the dummy pillar along a plane parallel to the first substrate has a plurality of linear edges.

5. The semiconductor structure of claim 1, wherein a cross section of the dummy pillar along a plane parallel to the first substrate comprises a first portion having a first longitudinal axis and a second portion having a second longitudinal axis, the first longitudinal axis intersecting the second longitudinal axis.

6. The semiconductor structure of claim 1, further comprising a second substrate attached to the first substrate, the second substrate having a solder resist mask, the dummy pillar extending into an opening in the solder resist.

7. The semiconductor structure of claim 1, further comprising a second substrate attached to the first substrate, the second substrate having a solder resist mask, the dummy pillar contacting an upper surface of the solder resist.

8. A semiconductor structure comprising:
a first substrate;
a plurality of active pillars on the first substrate, the plurality of active pillars being electrically active; and
a plurality of dummy pillars on the first substrate, each dummy pillar being inactive to transmit signals, the dummy pillars having a first width less than a second width of the active pillars.

9. The semiconductor structure of claim 8, wherein a ratio of the first width to the second width is equal to or greater than about 0.2 and equal to less than about 0.9.

10. The semiconductor structure of claim 8, further comprising a second substrate attached to the first substrate such that the plurality of dummy pillars extends through openings in an upper layer of the second substrate.

11. The semiconductor structure of claim 8, further comprising a second substrate attached to the first substrate such that the plurality of dummy pillars contacts an uppermost surface of the second substrate.

12. The semiconductor structure of claim 8, wherein the plurality of dummy pillars includes dummy pillars in one or more corners of the first substrate.

13. The semiconductor structure of claim 8, wherein the plurality of dummy pillars includes one or more dummy pillars along an edge between adjacent corners of the first substrate.

14. The semiconductor structure of claim 8, wherein the plurality of dummy pillars includes one or more pillars in an interior portion of the first substrate.

15. A method of forming a device, the method comprising:
providing a first substrate having one or more electrical contacts;
forming a patterned mask over the substrate, the patterned mask having dummy pillar openings and active pillar openings;
forming dummy pillars in the dummy pillar openings and forming active pillars in the active pillar openings, a width of the dummy pillars being less than a width of the active pillars; and
removing the patterned mask.

16. The method of claim 15, wherein at least some of the dummy pillars are positioned in corners of the substrate.

17. The method of claim 16, wherein at least some of the dummy pillars are positioned along an edge of the substrate between adjacent corners.

18. The method of claim 15, further comprising attaching the first substrate to a second substrate.

19. The method of claim 18, wherein the second substrate has a solder resist formed thereon and the dummy pillars contact an upper surface of the solder resist.

20. The method of claim 18, wherein the second substrate has a solder resist formed thereon and the dummy pillars extend into respective openings in the solder resist.

* * * * *